(12) United States Patent
Horning

(10) Patent No.: US 6,858,541 B2
(45) Date of Patent: Feb. 22, 2005

(54) ETCH STOP CONTROL FOR MEMS DEVICE FORMATION

(75) Inventor: Robert D. Horning, Savage, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/213,134

(22) Filed: Aug. 5, 2002

(65) Prior Publication Data

US 2004/0023424 A1 Feb. 5, 2004

(51) Int. Cl.⁷ .............................................. H01L 21/311
(52) U.S. Cl. .......................... 438/694; 438/52; 438/53
(58) Field of Search ......................................... 438/694

(56) References Cited

U.S. PATENT DOCUMENTS

| | | | |
|---|---|---|---|
| 4,549,427 A | | 10/1985 | Kolesar, Jr. |
| 5,417,235 A | * | 5/1995 | Wise et al. ................... 137/1 |
| 5,528,452 A | | 6/1996 | Ko |

2002/0075021 A1   6/2002   Aldaz et al.

OTHER PUBLICATIONS

Ashruf, C. M., et al., "Electrochemical etch stop Engineering for Bulk Micromachining", *Mechatronics, vol. 8 , (5),* Pergamon Press, Oxford, G.B, ISSN: 0957-4158,(Aug. 01, 1998),595–612.

* cited by examiner

*Primary Examiner*—Douglas Wille
(74) *Attorney, Agent, or Firm*—Schwegman, Lundberg, Woessner & Kluth, P.A.

(57) ABSTRACT

A microelectromechanical device is formed in a silicon semiconductor substrate. A metalization layer is formed on a glass wafer. A metal cap layer is then formed on the metalization layer, such that combined layers have a small surface work function that is less than approximately 5.17 eV. The semiconductor substrate is anodically bonded to the glass wafer, and then etched to remove silicon from the structures without significant excess etching of the microelectromechanical device, thus maintaining good control over critical dimensions of the microelectromechanical device.

16 Claims, 1 Drawing Sheet

ETCH STOP CONTROL FOR MEMS DEVICE FORMATION

FIELD OF THE INVENTION

The present invention relates to micro mechanical device formation, and in particular to etch stop control to enhance formation of micro mechanical devices.

BACKGROUND OF THE INVENTION

In the formation of micro mechanical devices, commonly referred to as MEMS devices, silicon or other semiconductor materials are used to form small structures. Semiconductor fabrication techniques are used to form the structures. One such technique is the use of wet chemical etching of the silicon to remove silicon in a controlled manner. Precise control of the etching is required to form critical dimensions required for some of the structures. An "etch stop" is used to achieve this control. One type of etch stop is accomplished by heavily doping a desired portion of the semiconductor with boron, and etching in an anisotropic etchant such as EDP or KOH. When the etchant reaches the heavily doped layer, the etch rate slows down by several orders of magnitude, effectively stopping the etching.

Metal layers are added to MEMS devices prior to etching to provide electrical contact with the silicon. The metal layers provide a good electrical contact but are not attacked by the etchant.

SUMMARY OF THE INVENTION

Electrochemical effects, due to the interaction of the silicon, the metal, and the wet etchant, can result in excess etching the silicon. This excess etching reduces dimensional control. Excess etching of semiconductor material such as silicon in MEMS devices is minimized by using a metalization of the semiconductor material having a small work function. In addition, the metalization is substantially inert to attack from the etchant, such as KOH or EDP.

In one embodiment, the work function of the metalization is smaller than approximately 5.17 eV. Some metals which provide both a small work function and are also resistant to selected etchants include chromium, rhodium, or tungsten. In a further embodiment, the thickness of the metal layer is between approximately 1000–3000 Angstroms.

In further embodiments, the metal layer comprises a layer of a metal having a high work function, capped with a metal having a lower work function. In some embodiments, that work function of the cap is substantially less than 5.17 eV.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
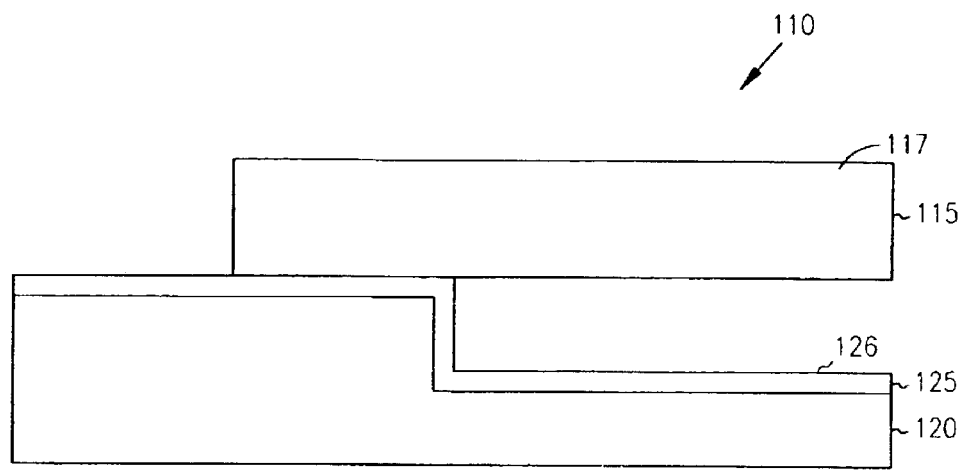
FIG. 1 is cross section of a portion of a MEMS device having a metalization with a small work function.

FIG. 1 is a cross section of a portion 110 of a microelectromechanical (MEMS) device, such as an angular rate sensor (i.e., a gyro). In this embodiment, a silicon sensor mechanism 115 is a rotating or moving part of the sensor. The thickness of the mechanism can be a critical dimension to the proper performance of the sensor. In one embodiment, a less than 1% variation in thickness is a desired tolerance.

In one embodiment, the silicon mechanism is formed in a heavily-boron-doped layer 117 deposited on or diffused in to a lightly doped substrate, also indicated at 115. The silicon mechanism plus substrate 115 is bonded to a glass substrate 120, such as Pyrex, for support. A low work function metal layer 125 formed on the glass substrate 120 provides a means for electrical contact with the MEMS device. The silicon substrate 115 is anodically bonded to the glass substrate 120. Once bonded, the lightly doped silicon substrate is etched away using common etchants, such as aqueous solutions of strong bases including KOH or EDP. Etching stops when the lightly doped substrate has etched away and the heavily-boron-doped material is exposed to the etchant. Since the etching stops, the timing of the etching may not be critical. When done properly, the only silicon remaining is the silicon mechanism.

Control of the dimensions of the silicon mechanism 115 requires a combination of etchant and boron concentration that has a high selectivity (i.e., the ratio of the etch rate in the undoped substrated to the etch rate in the heavily doped layer is very high). Selectivites >$10^3$ are achieved using EDP as the etchant and a boron concentration >$1 \times 10^{20}$ cm$^{-3}$.

The metal layer is selected to be resistant to attack by the etchant. Gold and Platinum are examples of metals with excellent resistance to EDP 14, however, an electrochemical effect has been discovered that appears to be created by the interaction of the silicon, metal and wet etchant. The electrochemical effect results in excess etching of the silicon as seen in prior art FIG. 2 at 150 and 155. Dissimilar materials, such as gold 127 and silicon 115, cause the silicon to etch beyond the etch stop. This etching results in the loss of accurate control of critical dimensions during the dissolved wafer process. Excess silicon is removed from all exposed surfaces of the silicon mechanism.

Figure 2:
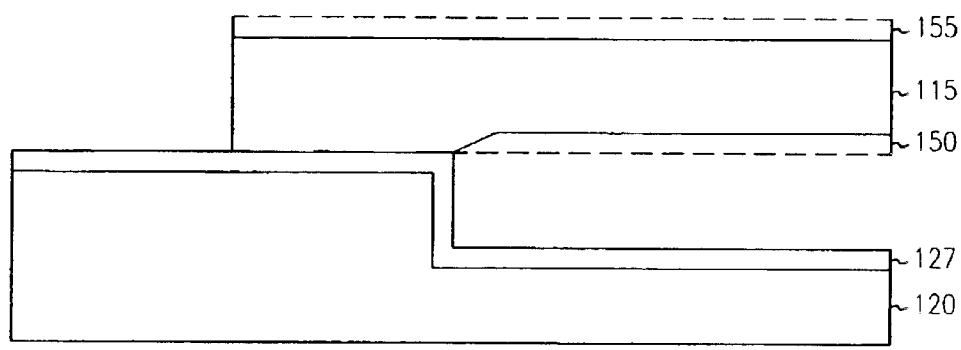
FIG. 2 is prior art cross section of a portion of a MEMS device having a metalization with a large work function and has continued etching beyond the etch stop point.

The numbering in FIG. 2 is consistent with FIG. 1 for like parts. In FIG. 2, the excess etched silicon is indicated by broken lines at 150 and 155, while the silicon mechanism is still represented as 115. The metalization layer is represented at 127 because it is different than metalization layer 125 in FIG. 1. Metalization 127 is prior art metalization having a high work function. Unless the etch is stopped at precisely the correct time, excess etching occurs.

To solve the excess, etching problem, the metalization layer 125 has a work function that is smaller than approximately 5.17 eV. The metalization is still resistant to the etchant. This maximum allowed work function is selected by computing the sum of the silicon bandgap (1.12 eV) and the electron affinity for silicon (4.05 eV). Several metals meet this criterion, such as Rhodium, Chromium, and Tungsten. Further metals, such as Ni and Pd are borderline, having work functions of approximately 5.17 eV. The selected metal, in addition to being resistant to the etchant should also provide a low resistance electrical contact with the silicon mechanism.

In one embodiment, the metal layer is between approximately 1000 to 3000 Angstroms thick. In a further embodiment, the silicon mechanism is etched to serve as a beam, supporting a moving part of the mechanism, such as an oscillating plate, or other sensing mechanism. The thickness control may need to be as small as plus or minus 0.1 microns. The MEMS device, of which the silicon mechanism is a part, may be a gyro, pressure sensor or accelerometer in one embodiment.

In a further embodiment, metal layer 125 is formed of gold, or some other metal having a work function greater than 5.17 eV, and includes a cap 126 of a metal layer on top of the gold. The cap 126 is formed by deposition, and has a work function less than 5.17 eV. Since the cap is in contact with the silicon, the excess etching is eliminated. The cap can be removed in selected areas to provide for better wire bonding. The cap, in one embodiment has a work function below approximately 5.0 eV, is resistant to the etchant, and is a barrier between the gold and silicon during wafer bonding. Cr meets the first two criteria, but may not be a good barrier if subjected to temperatures at or above approximately 250 degrees Celsius. Rhodium meets all criteria. Ti, W, or Mo are also candidates. In addition to gold, high work function metals such as Pt, Pd or Ni are used in conjunction with the lower work function metals being used as a cap. Such combinations of metals should have a surface work function below 5.17 eV. It is understood that while Rhodium, Chromium and Tungsten are preferred candidates; other metals meeting the requirements are also possible.

What is claimed is:

1. A method of forming microelectromechanical devices, the method comprising:

forming micro mechanical structures on a semiconductor substrate;

forming a metalization layer on selected micro mechanical structures, such that the metalization layer has a small work function; and etching the substrate to remove silicon from the structures without significant excess etching of the structures.

2. The method of claim 1 wherein the work function of the metal is less than approximately 5.17 eV.

3. The method of claim 1 wherein the metalization comprises chromium, rhodium, or tungsten.

4. The method of claim 1 wherein the selected silicon structures are heavily doped with boron.

5. The method of claim 4, wherein an etch stop is controlled by selecting appropriate metals to achieve a resulting thickness of the silicon structures to less than approximately 1% tolerance.

6. A method of forming microelectromechanical devices, the method comprising:

forming micro mechanical structures in a semiconductor layer;

forming a metalization layer on a glass wafer;

forming a metal cap layer on the metalization layer, such that the surface has a small work function;

bonding the semiconductor to the glass wafer, and etching the semiconductor to remove silicon from the structures without significant excess etching of the structures.

7. The method of claim 6 wherein the work function of the metal cap surface is less than approximately 5.17 eV.

8. The method of claim 6 wherein the metalization layer comprises gold, and the cap comprises chromium, rhodium, or tungsten.

9. The method of claim 6 wherein the semiconductor substrate comprises silicon having selected portions heavily doped with boron.

10. A method of forming microelectromechanical devices, the method comprising:

forming micro mechanical structures in a semiconductor layer;

forming a metalization layer on a glass wafer, such that the metalization layer has a small work function;

bonding a portion of the semiconductor substrate to a glass substrate; and etching the semiconductor to remove silicon from the structures without significant excess etching of the structures.

11. A method of forming microelectromechanical devices, the method comprising:

forming micro mechanical structures in a semiconductor layer;

forming a metalization layer on a glass wafer;

forming a metal cap layer on the metalization layer, such that combined layers have a small surface work function;

bonding a portion of the semiconductor substrate to a glass substrate; and etching the semiconductor to remove silicon from the structures without significant excess etching of the structures.

12. A method of forming microelectromechanical devices, the method comprising:

forming an etch stop to define a micro mechanical structure in a semiconductor layer;

forming a metalization layer on a substrate having a small surface work function;

bonding a portion of the semiconductor layer to the metalized substrate; and etching the semiconductor to remove silicon from the structures up to the etch stop in the presence of the metalization layer without significant excess etching of the structures if etching continues after the etch stop is reached.

13. The method of claim 12 wherein the work function of the metal is less than approximately 5.17 eV.

14. The method of claim 12 wherein the metalization comprises chromium, rhodium, or tungsten.

15. The method of claim 12 wherein forming the etch stop comprises heavily doping silicon with boron.

16. The method of claim 15, wherein excess etching is controlled by selecting appropriate metals to achieve a resulting thickness of the silicon structures to less than approximately 1% tolerance.

* * * * *

UNITED STATES PATENT AND TRADEMARK OFFICE
CERTIFICATE OF CORRECTION

| | | |
|---|---|---|
| PATENT NO. | : 6,858,541 B2 | Page 1 of 1 |
| DATED | : February 22, 2005 | |
| INVENTOR(S) | : Robert D. Horning | |

It is certified that error appears in the above-identified patent and that said Letters Patent is hereby corrected as shown below:

Column 2,
Line 38, please delete "EDP 14, however" and insert -- EDP. However --

Signed and Sealed this

Twelfth Day of July, 2005

JON W. DUDAS
*Director of the United States Patent and Trademark Office*